United States Patent [19]

Tatsuno et al.

[11] Patent Number: 5,442,445
[45] Date of Patent: Aug. 15, 1995

[54] REGISTRATION METHOD AND APPARATUS THEREFOR

[75] Inventors: Kyoichi Tatsuno, Yamato; Toshiya Umeda, Yokohama; Ryoichi Hirano, Tokyo, all of Japan

[73] Assignee: Kabushiki Kaisha Toshiba, Kawasaki, Japan

[21] Appl. No.: 173,879

[22] Filed: Dec. 27, 1993

Related U.S. Application Data

[63] Continuation of Ser. No. 640,999, Jan. 14, 1991, abandoned.

[30] Foreign Application Priority Data

Feb. 8, 1990 [JP] Japan .................................. 2-270087

[51] Int. Cl.$^6$ ............................................. G01B 11/00
[52] U.S. Cl. .................................................. 356/401
[58] Field of Search ............................. 356/399–401; 355/43, 53

[56] References Cited

U.S. PATENT DOCUMENTS

| | | | |
|---|---|---|---|
| 4,275,306 | 6/1981 | Kato et al. | 200/548 |
| 4,629,313 | 12/1986 | Tanimoto | 356/401 |
| 4,636,626 | 1/1987 | Hazama et al. | 200/201 |
| 4,886,974 | 12/1989 | Ina | 356/400 |
| 4,962,318 | 10/1990 | Nishi | 356/401 |

FOREIGN PATENT DOCUMENTS

| | | |
|---|---|---|
| 2822269C2 | 12/1981 | Germany . |
| 56-2284 | 1/1981 | Japan . |
| 60-37731 | 2/1985 | Japan . |
| 2139348A | 11/1984 | United Kingdom . |

OTHER PUBLICATIONS

Taniguchi et al, "Alignment Pattern Detection Method Using Diagonal Imaging Optics for X-ray Exposure System" vol. 55 #9, pp. 139–145.

IBM Technical Disclosure Bulletin, vol. 17, No. 10, Mar. 1975, pp. 2890–2892, H. A. Khoury, "2-D Area Array Solid–State Feedback Automatic Wafer Alignment System".

*Primary Examiner*—Richard A. Rosenberger
*Assistant Examiner*—K. P. Hantis
*Attorney, Agent, or Firm*—Oblon, Spivak, McClelland, Maier & Neustadt

[57] ABSTRACT

A registration system for registering a target registration object with respect to a predetermined reference position by using a registration mark formed on the target registration object includes the intensity measurement step of receiving a mark image for a predetermined period of time by a storage type sensor while an area of the target registration object which includes the mark is illuminated, the storage type sensor having elements whose positional relationship is known with respect to the mark image, the process of obtaining a center position of the mark image on the storage type sensor in a positioning direction in accordance with outputs from the elements of the storage type sensor obtained in the intensity measurement step, the distance calculation step of calculating a distance between the reference position and the center position obtained by the process, and the moving step of moving the target registration object by a distance corresponding to the distance obtained in the distance calculation step.

3 Claims, 9 Drawing Sheets

REGISTRATION METHOD AND APPARATUS THEREFOR

This application is a Continuation of application Ser. No. 07/640,999, filed on Jan. 14, 1991, now abandoned.

BACKGROUND OF THE INVENTION

1. Field of the Invention

The present invention relates to a registration method and an apparatus therefor and, more particularly, to a registration method suitable for registration or positioning in a stepper used in the VLSI fabrication process and an apparatus therefor.

2. Description of the Related Art

In recent years, strong demand has arisen for registration techniques in a variety of fields, and their precision levels vary depending on the technical fields. For example, in a stepper used in the VLSI fabrication process, a registration precision of 1 μm or less is required.

A "vibration slit method" is known well as a high-precision registration method. General relative registration between a wafer table and a reticle in a stepper employing this "vibration slit method" will be briefly described below.

In a stepper, a wafer table is generally located below a projection lens, and a reticle having a transfer pattern is located above the projection lens. A reflection fiducial mark serving as a registration reference is formed on the wafer table, and a reflection reticle mark serving as a registration reference is formed on the reticle. Since the projection lens is present between the wafer table and the reticle, in order to register the wafer table and the reticle relative to each other, lighting having the same wavelength as that of exposure light is required. For this purpose, for example, a half mirror is used to illuminate the fiducial mark with the lighting having the same wavelength as that of the exposure light through the projection lens from the above. Light reflected by the fiducial mark and retransmitted through the projection lens is detected by a photodiode arranged above the half mirror. In the "vibration slit method", the center of the light-receiving surface of the photodiode serves as a registration reference position. In this "vibration slit method", a slit board is located in front of the photodiode. When the slit board is vibrated at a predetermined amplitude and a predetermined vibration frequency with respect to the reference position as the center, an output from the photodiode is changed in accordance with a difference between the reference position and the position of a fiducial mark image. When the position of the fiducial mark image coincides with the reference position, a slit vibration frequency component in the output from the photodiode becomes zero. By utilizing this phenomenon, the wafer table is so shifted that the slit vibration frequency component in the output from the photodiode becomes zero, thereby aligning the fiducial mark with the reference position. In this case, the position of the wafer table is measured by a laser interferometer or the like, and the measured value is stored as an origin of the wafer table.

In the same procedures as described above, the reticle mark is aligned with the reference position, the position of the reticle is measured by the laser interferometer or the like, and the measured value is stored as an origin of the reticle. Relative registration between the wafer table and the reticle is performed by the above procedures.

The above "vibration slit method" poses the following problems. More specifically, since registration must be performed while an output from the photodiode is monitored, registration cannot be performed in such a case that a lighting intensity of the lighting varies as a function of time, e.g., a pulsed laser beam must be used as lighting. In order to increase a registration resolution, a magnification of a mark image must be increased. In this case, however, the lighting intensity of the mark image is decreased, and the laser beam cannot be used as lighting, resulting in inconvenience.

A conventional "vibration slit method" which is known to be capable of performing registration at a relatively high precision cannot be used when lighting greatly varies as a function of time or the lighting intensity of the mark image is low.

SUMMARY OF THE INVENTION

It is an object of the present invention to eliminate the above drawbacks and to provide a registration method capable of performing high-precision registration and an apparatus therefor.

In order to achieve the above object of the present invention, there is provided a registration method and an apparatus therefor, wherein a registration mark is formed on a target registration object, and registration of the target registration object is performed with respect to a reference position by using this mark.

More specifically, there is provided a registration method comprising the step of illuminating an area including a mark of a target registration object, the step of receiving the mark image obtained by the step of illuminating the area for an arbitrary period of time by using a storage type sensor having elements whose positional relationship is known with respect to the reference position, the step of obtaining a center position of a lighting intensity variation on the storage type sensor in a mark image positioning direction in accordance with outputs from the elements of the storage type sensor, the step of obtaining a distance between the center position obtained by the step of obtaining the center position and the reference position in the positioning direction, and the step of moving the target registration object in correspondence with the distance obtained by the step of obtaining the distance.

According to the registration method of the present invention, the mark image obtained upon illumination is received by the storage type sensor. The storage type sensor is generally exemplified by a charge-coupled device (CCD) and converts a lighting intensity of the mark image into photoelectrons and stores them in its elements. The amount of photoelectrons depends on the intensity of lighting incident on each element and light-receiving time. When the lighting intensity of the mark image is low, the light-receiving time is prolonged to obtain a mark image signal having a high S/N (signal/noise) ratio. That is, the registration method of the present invention can sufficiently cope with a mark image having a magnification increased to increase the registration resolution.

Since the storage type sensor capable of storing the mark image information is used, no problem is posed even if lighting is pulse light. Since the mark image is received by the storage type sensor having elements whose positional relationship is known with respect to the reference position, and the center position of the intensity variation on the storage type sensor in the mark image positioning direction is obtained from the outputs from the elements of the storage type sensor, it is possible to obtain the center position of the mark image with a resolution higher than a position detection sensitivity of the storage type sensor in accordance with relatively simple signal processing. Therefore, registration precision can be improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Figure 1A:
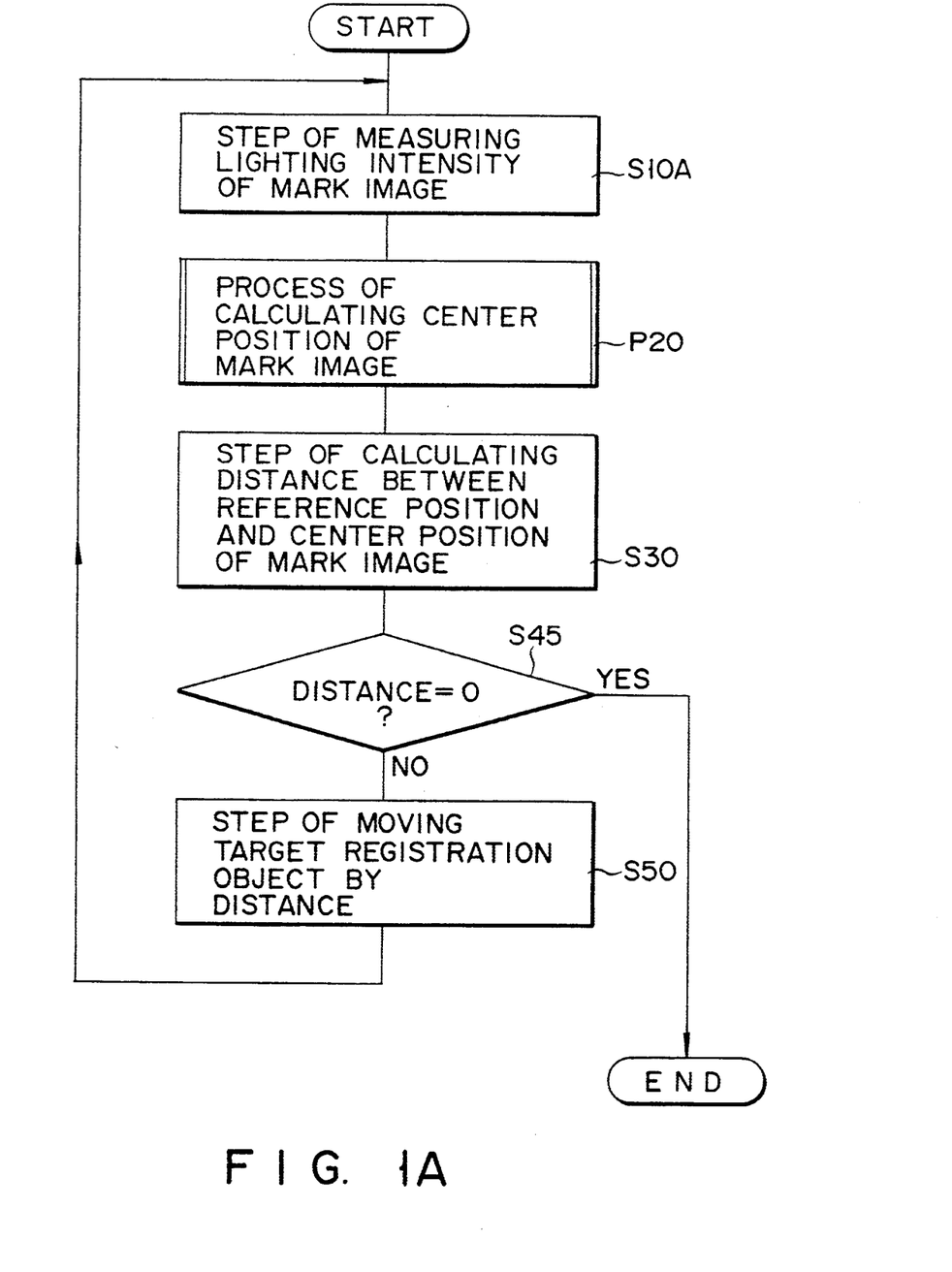
FIG. 1A is a schematic flow chart showing an embodiment of a registration system for practicing a registration method according to the present invention.
Figure 1B:
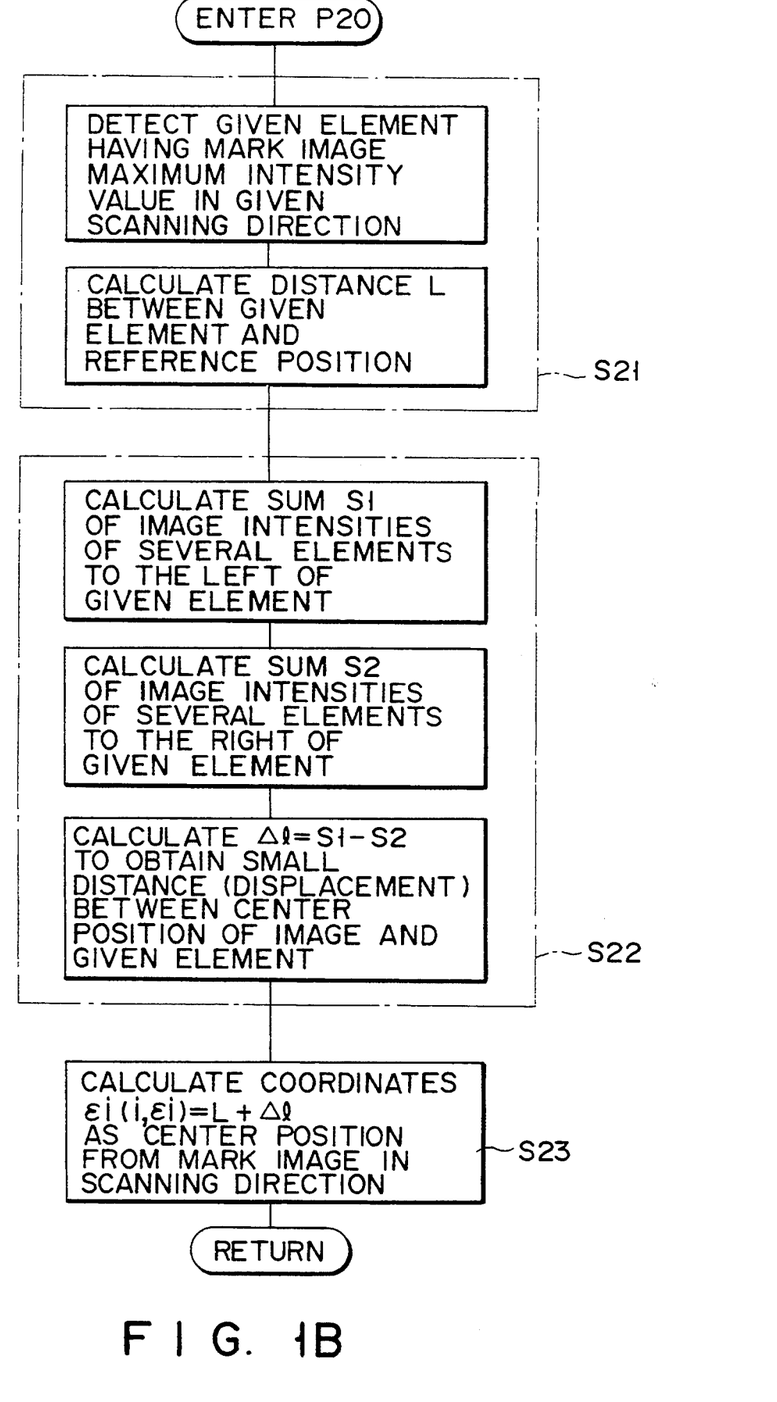
FIG. 1B is a detailed flow chart of an operation process (P20) in FIGS. 1A and 2.

As shown in flow charts of FIGS. 1A and 1B, procedures of a registration method as the first embodiment of the present invention are constituted by the respective steps in the flow charts.

A registration method for registering a target registration object with respect to a reference position by using a registration mark formed on the target registration object comprises the step (S10A) of receiving a mark image for an arbitrary period of time by using a sensor while a target registration object area including the mark is illuminated, and of measuring a lighting intensity of the mark image, the process (P20) (to be described in detail later) of measuring a center position of the mark image, the step (S30) of calculating a distance between the mark image center position obtained by process P20 and the reference position, determination step (S45) of terminating a series of registration operations when the distance obtained in step S30 is determined to be zero, and the step (S50) of moving the target registration object by a distance obtained in step S30 when the distance is not zero.

The process (P20) as a subroutine for measuring the center position of the mark image is constituted by three operation steps in FIG. 1B. Processing associated with the lighting intensity of the mark image in a large number of elements constituting a photo element (element) substrate is performed in an arbitrary scanning direction, e.g., a horizontal direction, in the following order.

An element having a maximum value of the lighting intensity of the mark image in a predetermined scanning direction is detected, and a distance L between the detected element and the reference position is calculated (step S21).

A sum S1 of image intensities associated with several left elements, a sum S2 of image intensities associated with several right elements, and a small difference between the baseline and the center of the image, i.e., $\Delta l = S1 - S2$, is calculated (step S22).

A displacement (on a given scanning line) $\epsilon = L + \Delta l$ is calculated on the basis of the distance L and the small difference $\Delta l$ (step S23).

According to the sequence of the method of the present invention, as in a registration apparatus in FIG. 3 (to be described in detail later), the illuminated mark image is received by a storage type sensor (14). A charge-coupled device serving as the storage type sensor (14) converts the lighting intensity of the mark image into photoelectrons, and the photoelectrons are stored in the CCD elements. The amount of photoelectrons depends on the intensity of lighting incident on each element and light-receiving time. When the lighting intensity of the mark image is low, the light-receiving time is prolonged to obtain a mark image signal having a high S/N ratio. That is, the method can sufficiently cope with a mark image having a magnification increased to increase a registration resolution. Since the storage type sensor capable of storing mark image information is used, no problem is posed when lighting is pulse light. Since the mark image is received by the storage type sensor having elements whose positional relationship is known with respect to the reference position, and the center position of the intensity variation on the storage type sensor in the mark image positioning direction is obtained from the outputs from the elements of the storage type sensor, it is possible to obtain the center position of the mark image with a resolution higher than a position detection sensitivity of the storage type sensor in accordance with relatively simple signal processing. Therefore, there are provided a registration method capable of performing high-precision registration as the object of the present invention and an apparatus for realizing this method.

Figure 2:
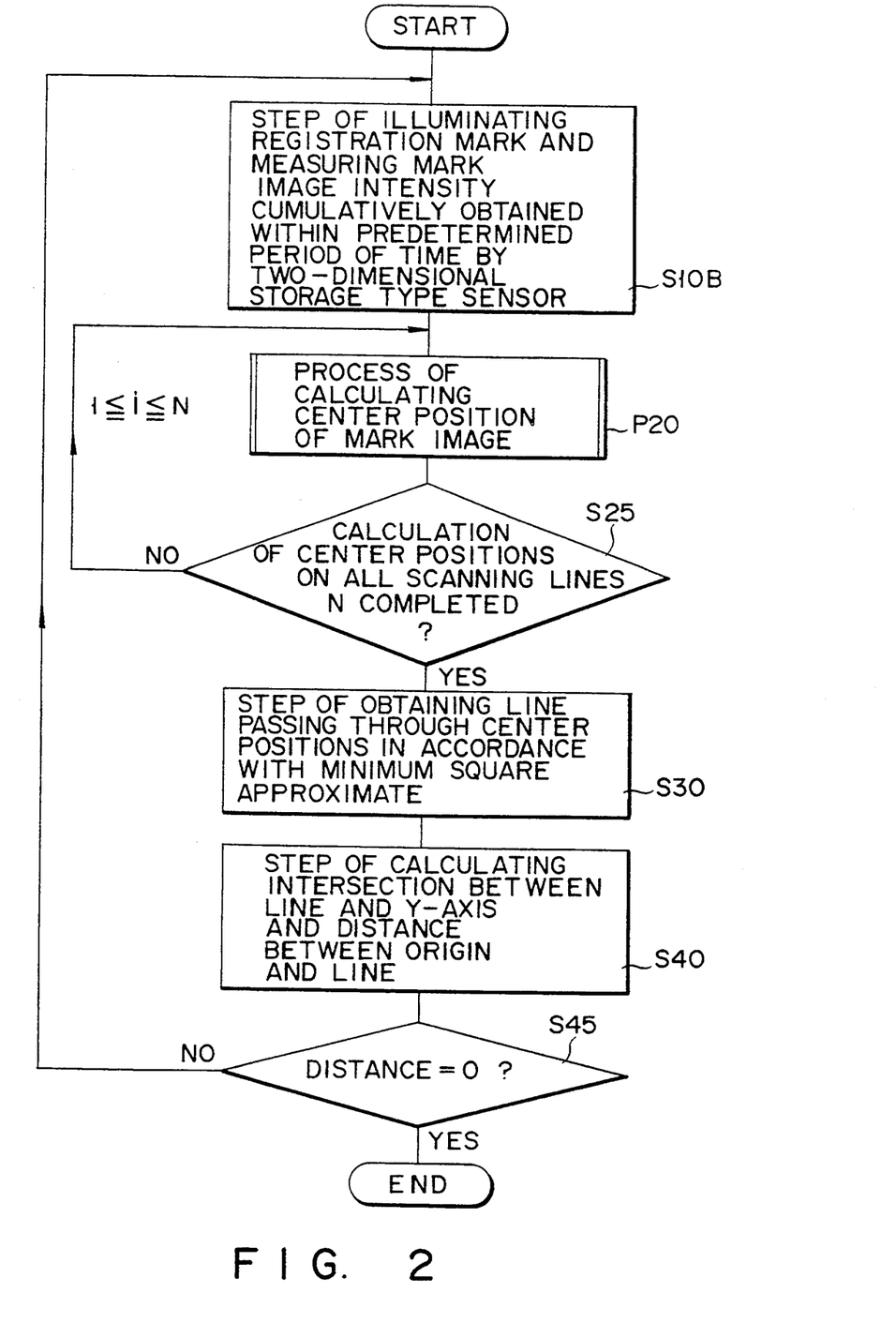
FIG. 2 is a schematical functional block flow chart of another embodiment of a registration method according to the present invention.

As shown in FIG. 2 and the flow chart of FIG. 1B, a registration method representing the second embodiment is constituted by the following processing steps.

More specifically, this registration method comprises the step (S10B) for measuring a lighting intensity of a mark image cumulatively stored by a two-dimensional storage type sensor within a predetermined period of time while an area of a target registration object which includes a band-like mark is illuminated, the process (P20) (as previously described in detail) of measuring a center position (coordinates) $(i, \epsilon i)$ of the ith mark image in an arbitrary scanning direction, the determination step (S25) of determining whether measurements of center positions of the marks in the directions of all the first-ith-Nth (i:1 to N) scanning lines are completed, the step (S30) of obtaining a line passing through the center positions of $(i,\epsilon i)1 - (i,\epsilon i)i - (i,\epsilon i)N$ in accordance with least square approximate performed upon completion of the above determination, the step (S30) of calculating an intersection between the line obtained in step S30 and the y-axis as the baseline of the scanning direction and a distance between the origin and the line, and the determination step (S45) of terminating a series of registration operations when the distance obtained in step S30 is zero.

Main differences between the first embodiment (FIG. 1A) and the second embodiment (FIG. 2) are as follows.
(1) A band-like registration mark is employed, and light reflected by this mark is received by the two-dimensional storage type sensor. A value cumulatively obtained within a predetermined period of time is employed as its lighting intensity.
(2) The process (P20) of measuring the center position of the mark image is repeated every arbitrary number of scanning lines.
(3) In order to obtain a line passing through the center positions of the mark images as a result of operation (2), an arithmetic unit (e.g., a CPU) calculates the line in accordance with the minimum square approximate.

The operations are described in detail later with reference to FIGS. 4 to 12.

Figure 3:
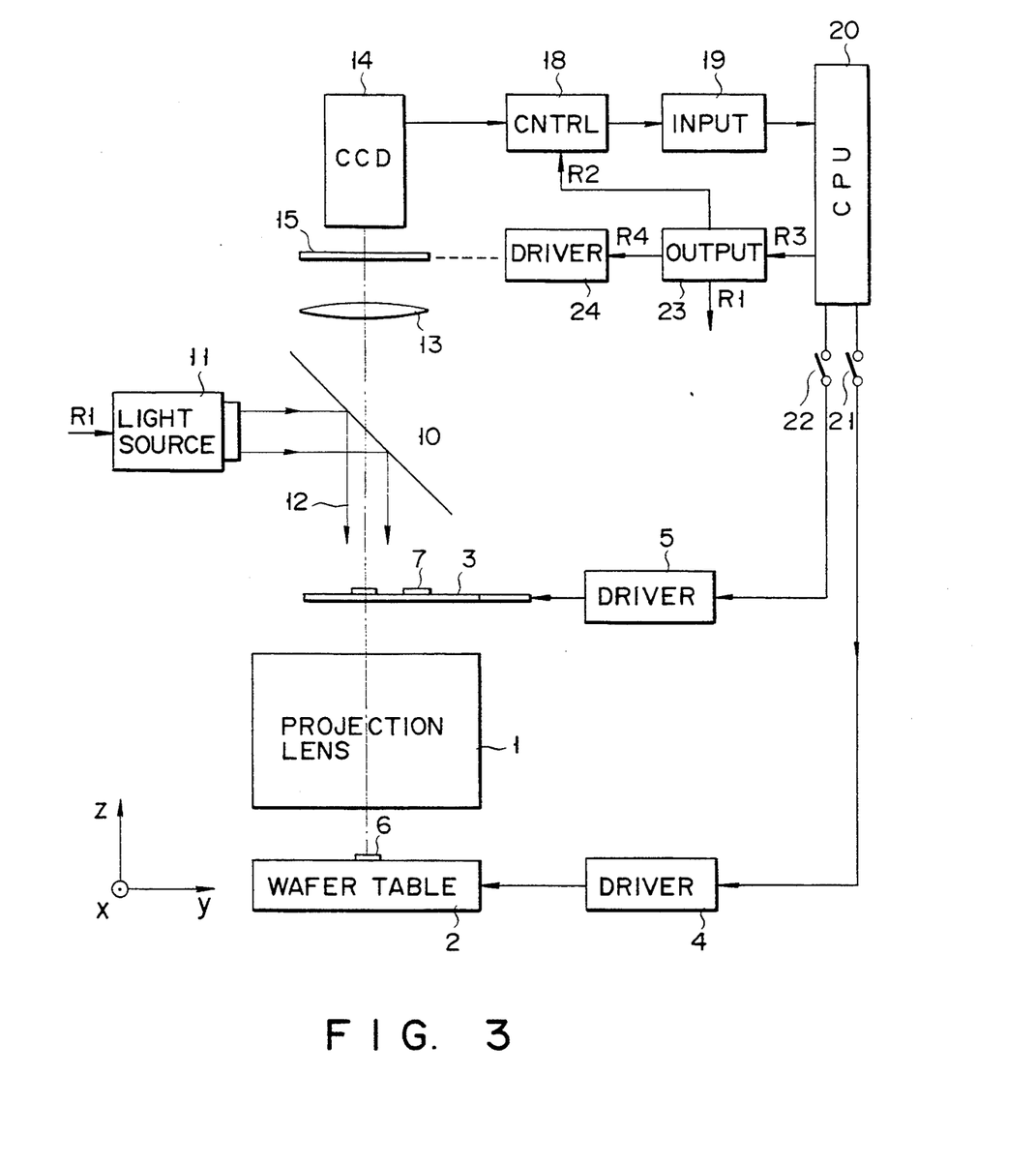
FIG. 3 is a diagram showing an apparatus for realizing a registration method of the present invention, and more specifically, showing an embodiment of a registration system used for registering a wafer table and a reticle relative to each other in a stepper.
Figure 4:
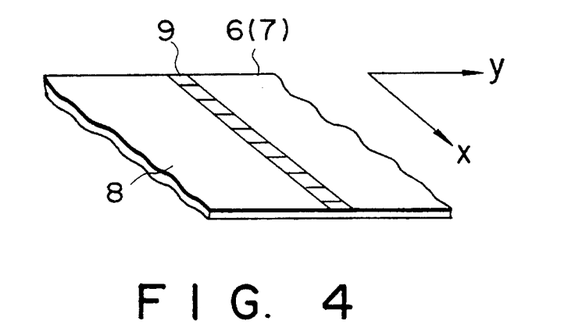
FIG. 4 is a perspective view showing an embodiment of a registration mark formed on the wafer table or reticle.

A stepper shown in FIGS. 3 and 4 employs the method of the present invention and constitutes a registration apparatus for performing registration of a target registration object with respect to a reference position by using a registration mark formed on the target registration object in accordance with the method of the present invention. In order to perform relative registration between a wafer table and a reticle, the apparatus of the present invention has the following arrangement.

A wafer table 2 for holding a wafer as a photosensitive body is located below a projection lens 1. A reticle 3 having a transfer pattern is located above the projection lens 1.

The wafer table 2 and the reticle 3 are supported to be movable in the x- and y-directions by a support mechanism (not shown). The wafer table 2 is controlled to be movable on the x-y plane by a wafer table driver 4. The reticle 3 is controlled to be movable on the x-y plane by a reticle driver 5. A fiducial mark 6 serving as a registration reference is formed on the upper surface of the wafer table 2. A reticle mark 7 serving as a registration reference is similarly formed on the reticle 3.

As shown in FIG. 4, each of the fiducial mark 6 and the reticle mark 7 is constituted by a transparent section 8 and a mark section 9 made of a reflecting surface.

The mark section 9 generally has a cross or L-shaped mark which allows registration in both the X- and y-directions. For the sake of descriptive convenience, assume that y-direction registration is described, and the mark section 9 extends like an elongated band in the x-direction.

A half mirror 10 is inclined at 45° from an optical axis above the reticle 3. A light source unit 11 for emitting lighting rays required for registration is located at a position opposite to the half mirror 10. The light source unit 11 emits light having the same wavelength as that of the exposure light. Lighting 12 emitted from the light source unit 11 is incident on the projection lens 1 through the half mirror 10. In this embodiment, an excimer laser source actually used for exposure serves as the light source unit 11. When exposure is actually performed, the half mirror 10 is replaced with a mirror. An excimer (excited dimer) laser source is a kind of pulse light source. The excimer laser source emits pulse light every time a start command signal R1 is input.

A magnification lens 13 is located above the half mirror 10. A storage type sensor (CCD or Charge-Coupled Device image sensor in this embodiment) 14 is located above the lens 13. The light-receiving surface of the storage type sensor 14 faces the projection lens 1. A shutter 15 is arranged at the light-receiving surface of the CCD image sensor 14.

The CCD image sensor 14 comprises a photo element section having a plurality of elements, arranged in a matrix form at a pitch of several tens of $\mu m$, for converting optical information into photoelectrons and storing them, a shift register section arranged in correspondence with the photo element section and capable of storing and retaining the photoelectrons stored in the respective elements of the photo element section, and a gate section arranged between the shift register section and the photo element section.

Figure 5:
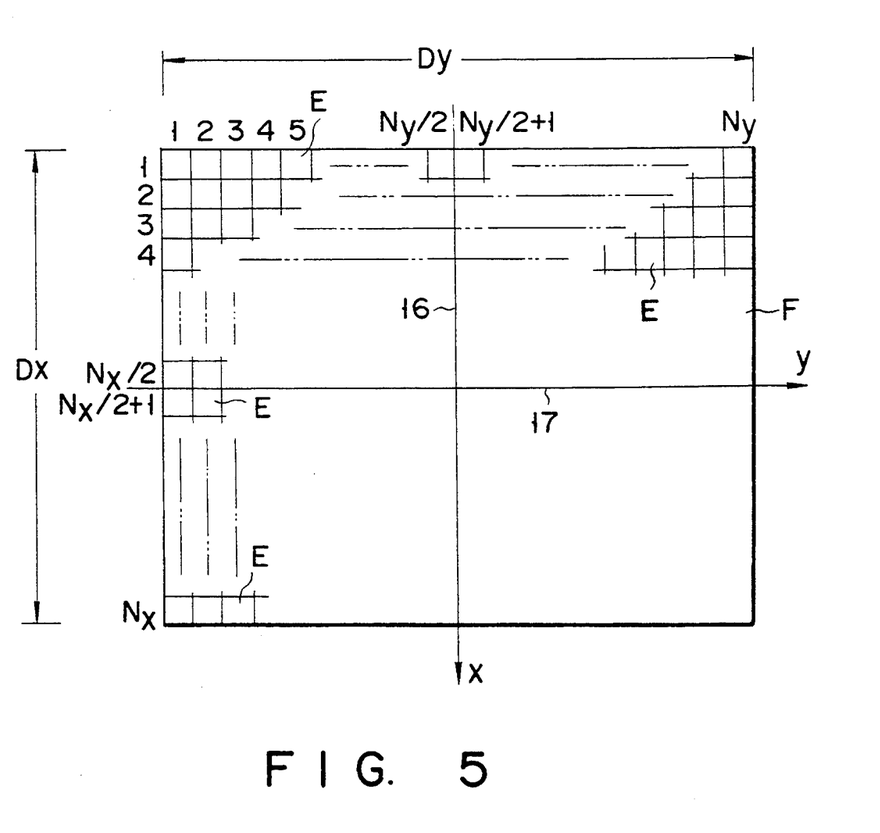
FIG. 5 is a view for explaining an arrangement of a photo element section of a CCD image sensor partially constituting the registration system shown in FIG. 3.

The photo element section F in FIG. 5 contains two-dimensionally arranged ($Ny \times Nx$) elements E, i.e., Ny elements in the y-direction and Nx elements in the x-direction. In this case, Ny and Nx are even numbers. A baseline 16 serving as the registration reference in the y-direction is formed along a boundary between the $Ny/2$ elements and the $(Ny/2+1)$ elements in the y-direction. A baseline 17 serving as the registration reference in the x-direction is formed along a boundary between the $Nx/2$ elements and the $(Nx/2+1)$ elements in the x-direction.

A read operation of the CCD image sensor 14 is controlled by a control circuit 18. When the control circuit 18 receives an operation start command R2 from an output unit 23 (to be described in detail later), the control circuit 18 supplies a gate signal to the gate section of the CCD image sensor 14 to simultaneously shift the photoelectrons stored in the respective elements E of the photo element section F to the shift register section. Thereafter, the control circuit 18 supplies a transfer pulse to the shift register to output bit photoelectrons as a time-serial voltage signal from the shift register section. The output time-serial signal is input to a CPU 20 through an input unit 19.

The CPU 20 processes the input signal in accordance with a sequence (to be described later). Slopes and displacements of the mark sections 9 of both the fiducial mark 6 and the reticle mark 7 with respect to the baseline 16 are calculated. The resultant position data for the fiducial mark 6 is supplied to the wafer table driver 4 through a switch 21, and the resultant position data for the reticle mark 7 is supplied to the reticle driver 5 through a switch 22. The CPU 20 outputs a start command R3 to the output unit 23 prior to the above operations.

The output unit 23 serves to control operation timings of the respective circuit components. When the output unit 23 receives the start command R3 from the CPU 20, the output unit 23 supplies a drive command R4 to a shutter driver 24. The output unit 23 also outputs the start command signal R1 to the light source unit 11 when the shutter 15 is opened upon operation of the shutter driver 24. When a predetermined period of time elapses upon output of the signal R1, the output unit 23 stops outputting the driver command R4 and then outputs the operation start command R2 to the control circuit 18.

Operations of the respective circuit components for performing relative registration between the wafer table 2 and the reticle 3 will be described with reference to these circuit components.

As described above, assume that each of the mark sections 9 of both the fiducial mark 6 and the reticle mark 7 extends like a band in the x-direction, and that these mark sections 9 are aligned with the baseline 16 formed on the CCD image sensor 14.

In order to register the wafer table 2 first, the position of the reticle 3 is slid in the y- or x-direction to prevent the reticle mark 7 from being illuminated.

By using a coarse registration unit (not shown), the position of the wafer table 2 is coarsely adjusted so that the fiducial mark 6 of the wafer table 2 is illuminated with the lighting 12.

When the switch 21 is turned on in this state, the operation of the CPU 20 is started. The CPU 20 outputs the start command R3 to the output unit 23. When the output unit 23 receives the start command R3, it outputs the drive command R4 to the shutter driver 24. The shutter driver 24 is actuated to open the shutter 15. Subsequently, the start command signal R1 is supplied to the light source unit 11. As a result, the light source unit 11 emits pulse light. The lighting 12 from the light source unit 11 is incident on the projection lens 1 through the half mirror 10, passes through the projection lens 1, and illuminates an area of the wafer table 2 which includes the fiducial mark 6. Light incident on the fiducial mark 6 is reflected by the mark section 9 formed of the reflecting surface. This light reflected by the mark section 9 is incident on the light-receiving surface, i.e., the photo element section F of the CCD image sensor 14 through the projection lens 1, the half mirror 10, and the lens 13.

Figure 6:
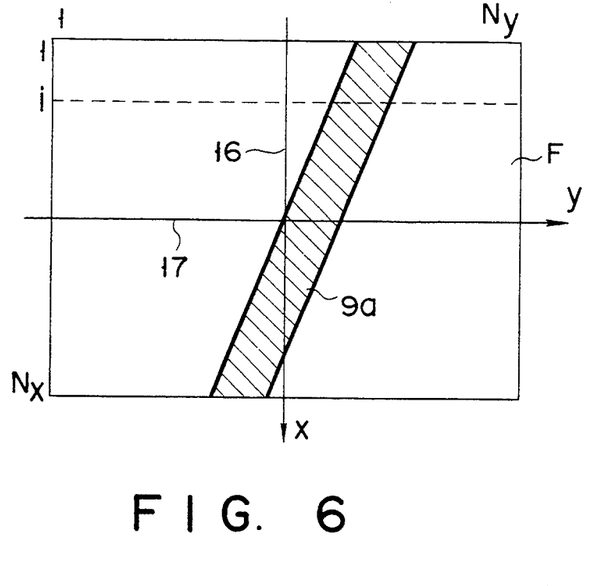
FIGS. 6 to 12 are views for explaining the process for obtaining a displacement in the system shown in FIG. 3.

A mark image 9a of the mark section 9 is formed on the photo element section F of the CCD image sensor 14, as indicated by a hatched portion in FIG. 6.

Figure 7:
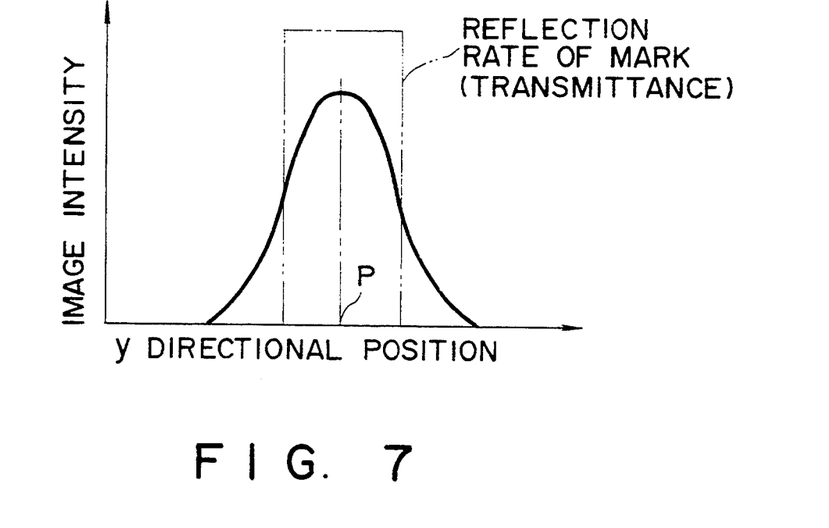

As indicated by the solid line in FIG. 7, an intensity variation in the widthwise direction of the mark image 9a, e.g., an intensity variation obtained on the ith scanning line, has a Gaussian distribution. Even if the distribution of the reflection rate (transmittance) of the mark section 9 has a rectangular shape, as indicated by the alternate long and two dashed line in FIG. 9, a Gaussian distribution is always obtained by a diffraction phenomenon or the like under the condition that the width of the mark section 9 is close to the wavelength of the lighting 12. In this distribution, a maximum value position P coincides with the center position of the mark image 9a (mark section 9) in the widthwise direction.

The intensity variation of the mark image 9a formed on the photo element section F of the CCD image sensor 14 is converted into photoelectrons by the respective elements E constituting the imaging surface of the mark image 9a. The photoelectrons are stored in all the elements E.

When a predetermined period of time elapses, the shutter 15 is closed. The output unit 23 then outputs the operation start command R2 to the control circuit 18. The control circuit 18 outputs a gate signal to the gate section of the CCD image sensor 14 and at the same time transfers the photoelectrons stored in the respective elements E of the photo element section F to the shift register section.

The control circuit 18 outputs a transfer pulse to the shift register section to time-serially output the bit photoelectrons from the shift register section. These bit photoelectrons are supplied to the CPU 20 through the input unit 19.

The CPU 20 processes the input signal in accordance with the following procedures (1) to (8). More specifically, (1) A frame identical with the photo element section F of the CCD image sensor 14 is created in the built-in computer, and the signal components read from the shift register section are stored in pixel memory elements constituting the frame in the same manner as in the photo element section F.

Figure 8:
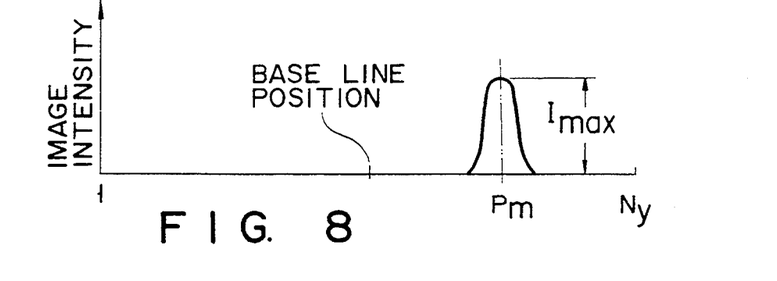
Figure 9:
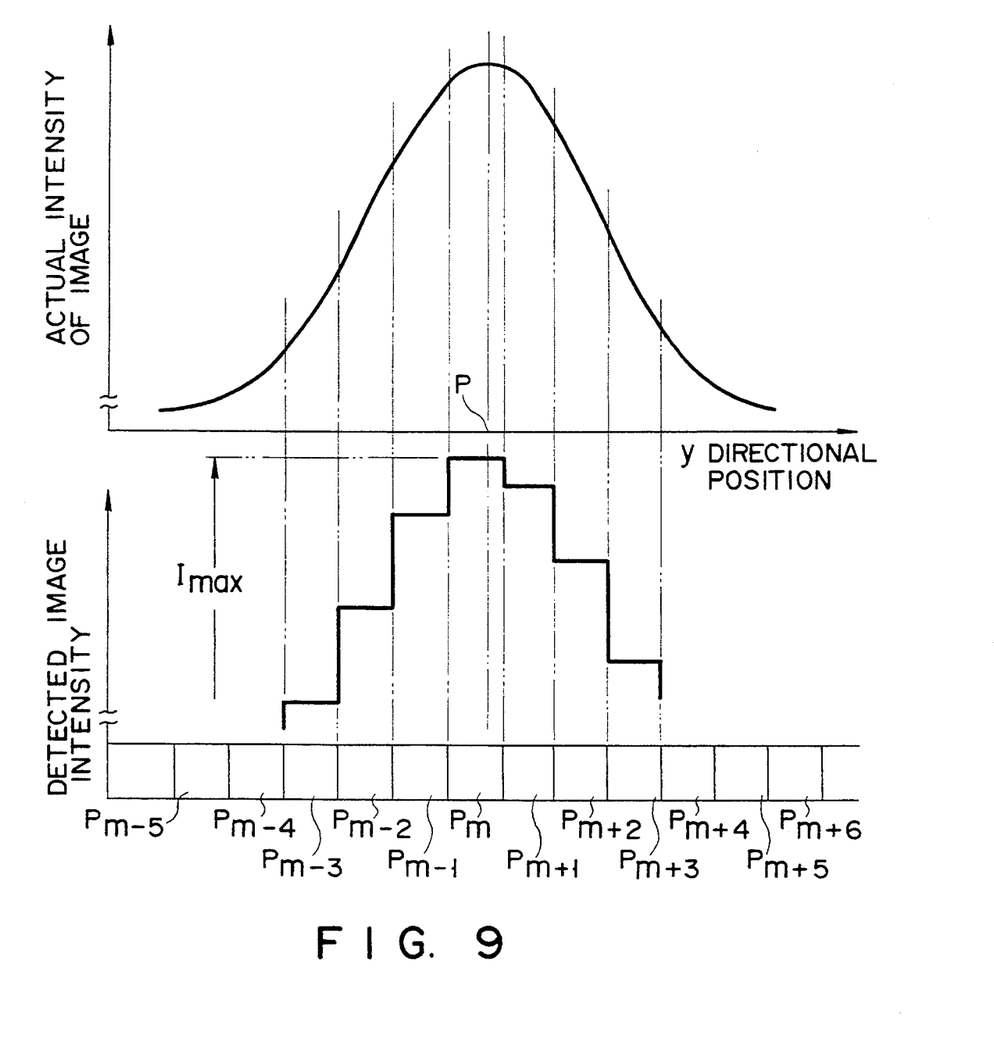

(2) The created frame is scanned along a given horizontal scanning line to find a pixel Pm whose image intensity has a maximum value $I_{max}$ on the given scanning line, as shown in FIG. 8.

Figure 11:
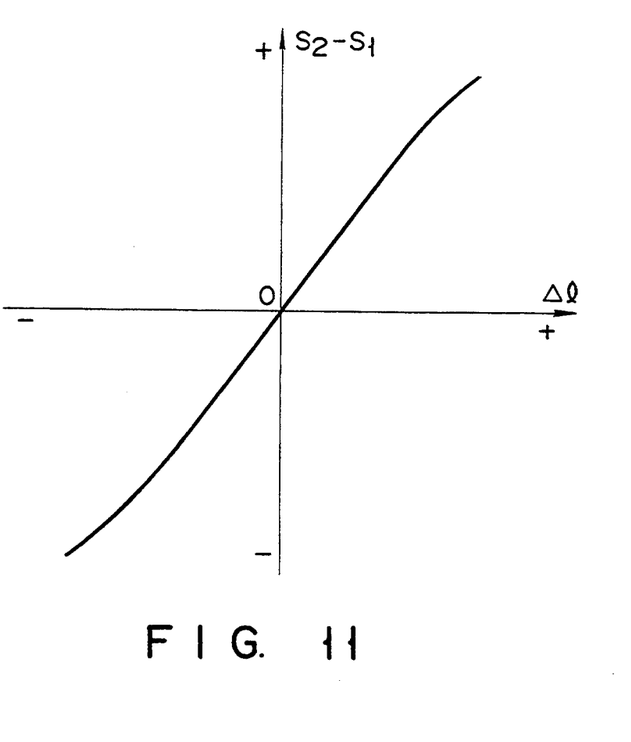

FIG. 11 shows a relationship between an actual intensity variation of the mark image 9a on the ith horizontal scanning line and an intensity variation of the ith scanning line of the frame which is obtained from each element. Since each element has a given width, the actual intensity variation of the mark image 9a does not coincide with the intensity variation obtained from each element. However, it is apparent that a center position P of the intensity variation of the mark image 9a is present within the y-direction width of the element Pm representing the maximum value $I_{max}$.

Figure 10:
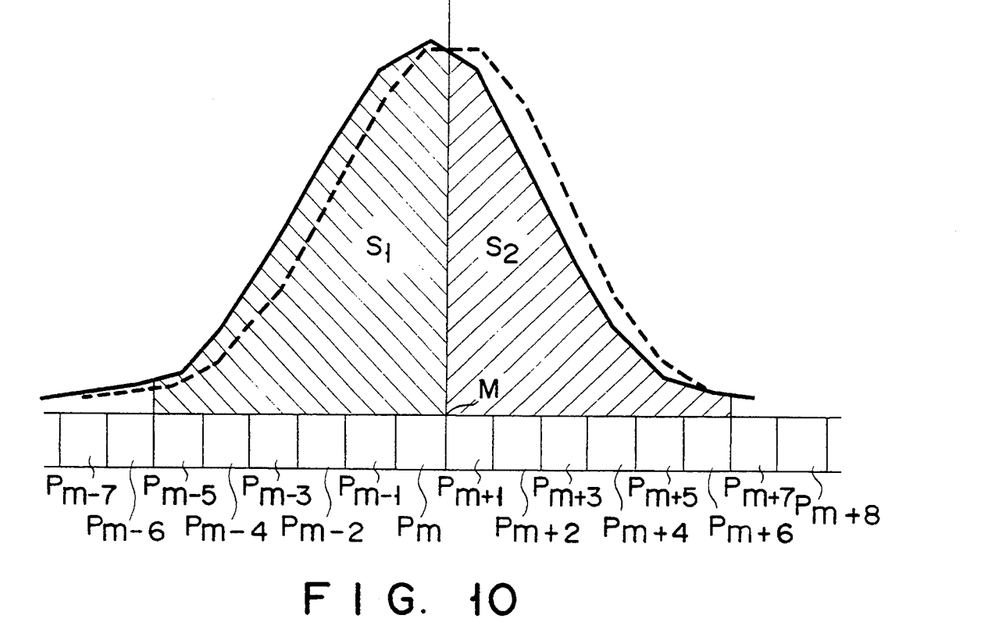

(3) As shown in FIG. 10, a distance Lmax between the baseline 16 and a boundary point M between the element Pm and an element Pm+1 to the immediately right of the element Pm is represented by $L_{max} = (Pm - Ny/2) \times \Delta y$ where $\Delta y$ is a y-direction width of one element. That is, if the y-direction width of the photo element section F of the CCD image sensor 14 is defined as Dy, relation $\Delta y = Dy/Ny$ is established.

(4) A small distance $\Delta l$ between the boundary point M and the center position P (the center position of the mark image 9a) of the actual intensity variation of the mark image 9a is calculated by using an image intensity signal. More specifically, as indicated by the solid line in FIG. 10, image data is normalized so that the maximum value $I_{max}$ obtained from the elements becomes 1 (i.e., an intensity variation pattern). Image data normalization can eliminate an influence of absolute values of image intensities.

(5) The following equations in which the normalized image data is represented as Ij (jth image data in the y-direction) are calculated:

$$S1 = \sum_{j=P_m-q+1}^{P_m} Ij$$

$$S2 = \sum_{j=P_m+1}^{P_m+q} Ij$$

Integral values of the right and left q pixels with respect to the boundary point M are obtained.

(6) The length $\Delta l$ is calculated by the relationship between (S2–S1) and $\Delta l$ shown in FIG. 11. The intensity variation pattern indicated by the broken line in FIG. 10 is obtained for $\Delta l = 0$.

(7) A value $\epsilon i = L_{max} + \Delta l$ is obtained on the basis of procedures (3) to (6) described above. Similarly, values $\epsilon i$ are obtained for all the first to Nxth horizontal scanning lines.

Figure 12:
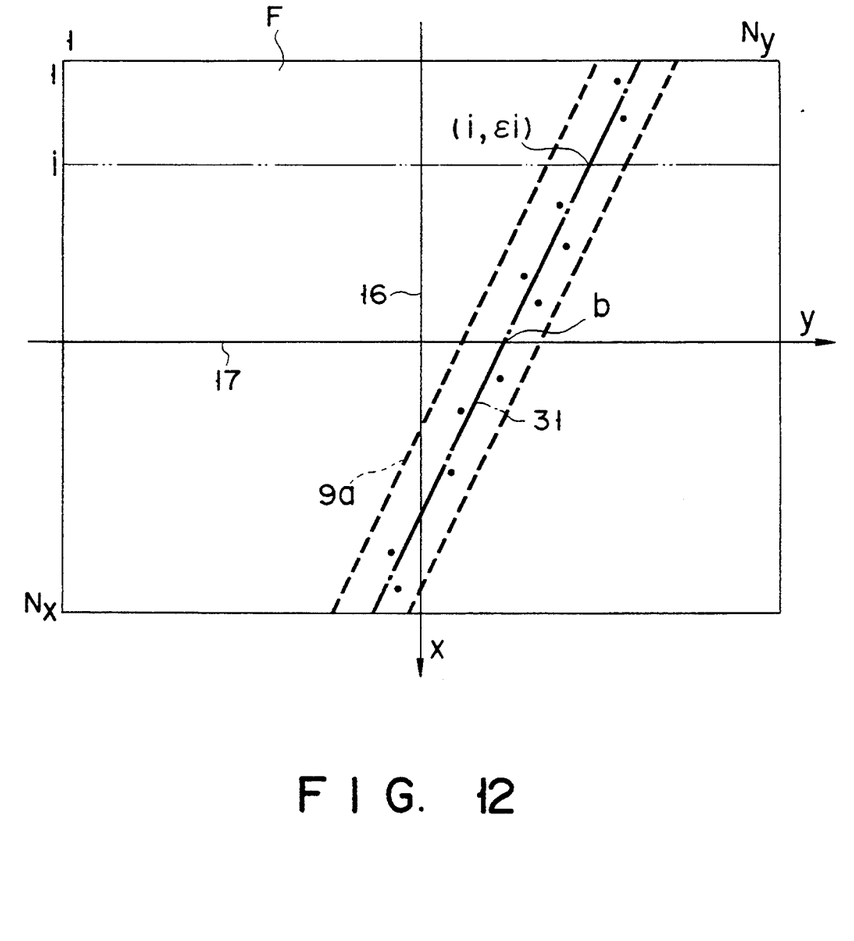

(8) As shown in FIG. 12, a line 31 of least square approximate of the calculated coordinates (i,$\epsilon i$) (i = 1, 2, 3, ..., Nx) is obtained. This line 31 is represented by equation y=ax+b, an intersection b between this line 31 and the y-axis is obtained as a displacement b from the baseline 16.

By the above operations, the slopes and displacements b of the mark section 9 of the fiducial mark 6 with respect to the baseline 16 can be obtained by the CPU 20. These position data are supplied to the wafer table driver 4 through the switch 21. The wafer table driver 4 controls the position of the wafer table 2 so that the center of the mark section 9 of the fiducial mark 6 coincides with the baseline 16. As a result, the wafer table 2 is registered with reference to the baseline 16. The position of the registered wafer table 2 is measured by a laser interferometer or the like, and the measured value is stored as an origin in the y-direction in, e.g., a memory.

The mark section 9 of the reticle mark 7 is also registered with respect to the baseline 16 in the same manner as described above. The position of the registered reticle 3 is measured by a laser interferometer or the like, and the measured value is stored as an origin in the y-direction in, e.g., a memory. By the above registration operations, relative registration between the wafer table 2 and the reticle 3 in the y-direction can be realized.

As described above, the CCD image sensor 14 as a storage type sensor is used to detect the mark image 9a. No problem is posed even if the lighting 12 is pulse light as in the above embodiment. The photoelectrons stored in the respective elements E of the CCD image sensor 14 are influenced by the intensity of lighting incident on each element E and the light-receiving time. When the lighting intensity of the mark image 9a is low, the light-receiving time is prolonged. That is, a period in which the shutter 15 is open is prolonged to obtain a mark image signal having a high S/N ratio. Therefore, the method of this embodiment can sufficiently cope with a mark image 9a having a magnification increased to increase a registration resolution.

Since a method of receiving the mark image 9a by the CCD image sensor 14 having the elements E whose positional relationship is known with respect to the reference position is adapted, the variation characteristics can be effectively utilized if the intensity variation in the positioning direction of the mark image 9a has a Gaussian distribution. Therefore, a displacement can be detected at a resolution higher than a position detection resolution (i.e., a resolution including that of the magnification lens) of the CCD image sensor in accordance with relatively simple signal processing. Therefore, high-precision registration can be performed.

As is apparent from the above embodiment, a linear regression method is performed to obtain a displacement b with good image reproducibility even if a mark is slanted in the z-direction, or when the width of the mark section and reflection rate varies depending on fabrication precision of the mark.

In the stepper, x-direction registration must also be performed in addition to the y-direction registration described above. In this case, each of the mark sections of the fiducial and reticle marks may have a cross or L-shaped mark. For example, y-direction registration is performed by using one side of the mark, and x-direction registration can be performed by using another side perpendicular to the side used in the y-direction registration.

The present invention is not limited to the embodiment described above, and may be modified as modifications (1) to (5) as follows.

(1) In the above embodiment, the CCD image sensor is used as a storage type sensor. However, a vidicon (tradename) or a storage sensor of a line sensor type having a plurality of linearly arranged elements may be used.

(2) A storage type sensor may be a pair of elements, e.g., a photodiode and a photoelectron storage capacitor, obtained by dividing a sensor area in the positioning direction. In this case, outputs from these elements are input to a differential amplifier to calculate a difference (S2−S1), and a linear analyzer outputs a signal proportional to the difference $\Delta l$, thereby simplifying the arrangement of the CPU.

(3) When a CCD sensor is used as a storage type sensor, high-speed dummy feed elimination processing is combined to eliminate the shutter 15.

(4) In the above embodiment, the mark section of each mark is constituted by a reflecting surface. However, the mark section may be constituted by a light-transmitting surface. In this case, the CCD image sensor is located below the wafer table.

(5) The present invention is not limited to registration in a stepper, but is apparently applicable to a variety of registration apparatuses without any modifications.

According to the present invention, there are provided a registration method of realizing high-precision registration without being adversely affected by the intensity and form of lighting, and an apparatus therefor.

Additional advantages and modifications will readily occur to those skilled in the art. Therefore, the invention in its broader aspects is not limited to the specific details, representative devices, and illustrated examples shown and described. Accordingly, various modifications may be made without departing from the spirit or scope of the general inventive concept as defined by the appended claims and their equivalents.

What is claimed is:

1. A registration method for registering a target registration object within reference orthogonal coordinates by using a single band-shaped registration mark formed on the target registration object, comprising:

an intensity measurement step of receiving a mark image for a predetermined period of time by a two-dimensional storage type sensor while an area of the target registration object which includes the registration mark is illuminated, said two-dimensional storage type sensor having a plurality of elements which are two-dimensionally arranged within the reference orthogonal coordinates whose positional relationship within the reference orthogonal coordinates is known, of cumulatively storing electric charge stimulated by light of the mark image, and of measuring a light intensity of the mark image;

a center position measurement process of measuring coordinates of a center position of the mark image associated with an arbitrary horizontal scanning line of the two dimensional storage type sensor on the basis of the light intensity obtained in said intensity measurement step;

a mark center line calculation step of least square approximation of coordinates of said center position obtained in said center position measurement process and of obtaining a line passing through the center position drawn within the reference orthogonal coordinates; and a distance calculation step of calculating an intersection between a first baseline of the coordinates and the line obtained in said line calculation step, and a distance between an origin of coordinates and the line;

wherein the line calculation step comprises:

obtaining a line equation of a line passing through center positions of a mark image in accordance with least square approximation;

calculating a displacement of said intersection from a second baseline, said second baseline being perpendicular to the axis of the scanning line;

obtaining a slope and a displacement of the line with respect to the second baseline;

obtaining positional data of the target registration object by utilizing the intensity measurement step, the center position measurement process, the mark center line calculation step and the distance calculation step; and moving the target registration object by an amount corresponding to the positional data.

2. A registration method for registering a target registration object within reference orthogonal coordinates by using a single band-shaped registration mark formed on the target registration object, comprising:

an intensity measurement step of receiving a mark image for a predetermined period of time by a two-dimensional storage type sensor while an area of the target registration object which includes the registration mark is illuminated, said two-dimensional storage type sensor having a plurality of elements which are two-dimensionally arranged within the reference orthogonal coordinates whose positional relationship within the reference orthogonal coordinates is known, of cumulatively storing electric charge stimulated by light of the mark image, and of measuring a light intensity of the mark image;

a center position measurement process of measuring coordinates of a center position of the mark image associated with an arbitrary horizontal scanning line of the two dimensional storage type sensor on the basis of the light intensity obtained in said intensity measurement step;

a mark center line calculation step of least square approximation of coordinates of said center position obtained in said center position measurement process and of obtaining a line passing through the center position drawn within the reference orthogonal coordinates; and a distance calculation step of calculating an intersection between a baseline of the coordinates and the line obtained in said line calculation step, and a distance between an origin of coordinates and the line;

wherein the process of obtaining the center position comprises:

utilizing that an intensity variation in the horizontal scanning line of the mark image in the two dimensional storage type sensor is symmetrical about a center, in the horizontal direction of the mark image;

scanning the mark image stored in said storage type sensor along the horizontal scanning line while an intensity variation of the horizontal scanning line of the mark image is symmetrical about a center of said mark image, and normalizing an output distribution of the mark image intensity along scanning lines;

after normalizing, obtaining a difference between two integral values of two opposite ranges having a width along a predetermined number of elements of the two dimensional sensor with respect to a boundary of said elements consisting of a given element which corresponds to a portion representing an output level of the output distribution changed from an "increase" to a "decrease" or a "decrease" to an "increase" and an element adjacent to another element of said predetermined number of elements;

a positional data step of utilizing the intensity measurement step, the center position measurement process, the mark center line calculation step and the distance calculation step to produce positional data of the target registration object; and moving the target registration object by an amount corresponding to the positional data.

3. A registration method for registering a target registration object within reference orthogonal coordinates by using a single band-shaped registration mark formed on the target registration object, comprising:

an intensity measurement step of receiving a mark image for a predetermined period of time by a two-dimensional storage type sensor while an area of the target registration object which includes the registration mark is illuminated, said two-dimensional storage type sensor having a plurality of elements which are two-dimensionally arranged within the reference orthogonal coordinates whose positional relationship within the reference orthogonal coordinates is known, of cumulatively storing electric charge stimulated by light of the mark image, and of measuring a light intensity of the mark image;

a center position measurement process of measuring coordinates of a center position of the mark image associated with an arbitrary horizontal scanning line of the two dimensional storage type sensor on the basis of the light intensity obtained in said intensity measurement step;

a mark center line calculation step of least square approximation of coordinates of said center position obtained in said center position measurement process and of obtaining a line passing through the center position drawn within the reference orthogonal coordinates; and a distance calculation step of calculating an intersection between a baseline of the coordinates and the line obtained in said line calculation step, and a distance between an origin of coordinates and the line;

wherein said center position measurement process comprises:

a step of detecting an element of said two dimensional sensor having a maximum light intensity value of a lighting variation of the mark image along a predetermined scanning line and calculating a distance L between the detected element and a baseline of the mark image;

a step of calculating a sum S1 of image intensities of several elements located to the left of said detected element and a sum S2 of image intensities of several elements located to the right of said detected element, and calculating a displacement Δl from S1−S2 in accordance with a relationship between Δl and S1−S2;

a step of calculating center position coordinate values (L+Δl) along the scanning line of the mark image;

a positional data step of utilizing the intensity measurement step, the center position measurement process, the mark center line calculation step and the distance calculation step to produce positional data of the target registration object; and moving the target registration object by an amount corresponding to the positional data.

* * * * *